United States Patent
Lee et al.

(10) Patent No.: US 8,493,306 B2
(45) Date of Patent: *Jul. 23, 2013

(54) SOURCE DRIVER AND METHOD FOR RESTRAINING NOISE THEREOF

(75) Inventors: Chuan-Che Lee, Tainan County (TW); Tsung-Yu Wu, Tainan County (TW); Yu-Jui Chang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 1293 days.

This patent is subject to a terminal disclaimer.

(21) Appl. No.: 11/850,931

(22) Filed: Sep. 6, 2007

(65) Prior Publication Data
US 2009/0066378 A1 Mar. 12, 2009

(51) Int. Cl.
*G09G 3/36* (2006.01)
(52) U.S. Cl.
USPC ............................. 345/98; 345/211; 327/143
(58) Field of Classification Search
USPC .................... 327/143; 345/98–100, 211–213
See application file for complete search history.

(56) References Cited

U.S. PATENT DOCUMENTS

| 6,639,590 | B2 * | 10/2003 | Takahashi et al. | 345/211 |
| 6,961,034 | B2 * | 11/2005 | Kusanagi | 345/211 |
| 2003/0062881 | A1 | 4/2003 | Crawford | |
| 2008/0024480 | A1 * | 1/2008 | Jee et al. | 345/212 |
| 2008/0129903 | A1 * | 6/2008 | Hong et al. | 349/36 |

FOREIGN PATENT DOCUMENTS

| TW | 200540743 | 12/2005 |
| TW | 200643872 | 12/2006 |

* cited by examiner

*Primary Examiner* — Michael Pervan
(74) *Attorney, Agent, or Firm* — Lowe Hauptman Ham & Berner, LLP

(57) ABSTRACT

The present invention discloses a source driver and a method for restraining noise output by a source driver during power on/off of a power supply. The source driver includes a data bus, a plurality of channels, a multiplexer and a plurality of output pads. The channels are connected to the output pads via the multiplexer. Each channel has a latch unit. Data is transmitted on the data bus and stored in the latch units. The source driver is powered by a first supply voltage from the power supply. The method comprises determining whether the first supply voltage is insufficient, and if yes, performing the following steps. First, set the data transmitted on the data bus to be a predetermined value. Then, keep the latch units turned on, thereby the data is sent out from the latch units. Then, keep the multiplexer turned on for outputting a driving voltage based on the data via the output pads.

11 Claims, 4 Drawing Sheets

SOURCE DRIVER AND METHOD FOR RESTRAINING NOISE THEREOF

FIELD OF THE INVENTION

This invention relates to a display, and more particularly, to a source driver of a display and a method thereof.

BACKGROUND OF THE INVENTION

Recently, liquid crystal displays (LCD) have been widely applied in electrical products due to the rapid progress of optical technology and semiconductor technology. Moreover, with advantages of high image quality, compact size, light weight, low driving voltage and low power consumption, LCDs have been introduced into portable computers, personal digital assistants and color televisions, and have become the mainstream display apparatus.

FIG. 1 shows a diagram of a conventional source driver 100 of the LCD. The source driver 100 includes channels (108, 110), a multiplexer 112, output pads (114,116), a databus 118 and a charge sharing switch 120. The channels 108 and 110 are connected to the output pads 114 and 116, respectively, via the multiplexer 112. The charge sharing switch 120 is electrically connected between the output pads 114 and 116 to share the voltages on the outputs if needed. Each channel has a shift register (122 or 132), a latch unit (123 or 133), a level shifter (128 or 138) and a digital-to-analog converter (DAC) (130 or 140). Each latch unit comprises a first latch (124 or 134) and a second latch (126 or 136) connected in series. The data is transmitted on the data bus 118 and stored in the latch units, and moreover, the data is stored first in the first latch and then stored in the second latch. The data is further sent to a display (not shown) via the output pads 114 and 116 to show corresponding images on the display.

However, when the power supply powering the source driver is being turned off, the power supplying to the source driver decreases and the channels may malfunction owing to the power insufficient, which results in abnormal images, such as line defects or band mura, shown on the display.

SUMMARY OF THE INVENTION

Therefore, an aspect of the present invention is to provide a source driver and a method for restraining noise thereof in which abnormal images shown on the display during power on/off of a power supply can be restrained.

Another objective of the present invention is to provide a source driver with a power down detector for detecting whether the power supply is turning on/off and if yes, asserting a reset signal.

In order to achieve the aforementioned aspects, the present invention provides a method for restraining noise output by a source driver during power on/off of a power supply. The source driver includes a data bus, a plurality of channels, a multiplexer and a plurality of output pads. The channels are connected to the output pads via the multiplexer. Each channel has a latch unit. Data is transmitted on the data bus and stored in the latch units. The source driver is powered by a first supply voltage from the power supply. The method comprises the following steps. First, determine whether the first supply voltage is insufficient, and if yes, perform the following steps. Set the data transmitted on the data bus to be a predetermined value. Then, keep the latch units turned on, thereby the data is sent out from the latch units. Then, keep the multiplexer turned on for outputting a driving voltage based on the data via the output pads.

To achieve the aforementioned aspects, the present invention provides a source driver powered by a power supply. The source driver comprises a data bus, at least two channels, a multiplexer, at least two output pads and a power down detector. Each channel has a latch unit. Data is transmitted on the data bus and stored in the latch units. The output pads are coupled to the channels via the multiplexer. The power down detector is used for detecting whether a first supply voltage from the power supply is insufficient and if yes, asserting a reset signal. If the reset signal is asserted, the data transmitted on the data bus is set to be a predetermined value, the latch units are turned on, thereby the data is sent out from the latch units, and the multiplexer is turned on for outputting a driving voltage via the output pads based on the data.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
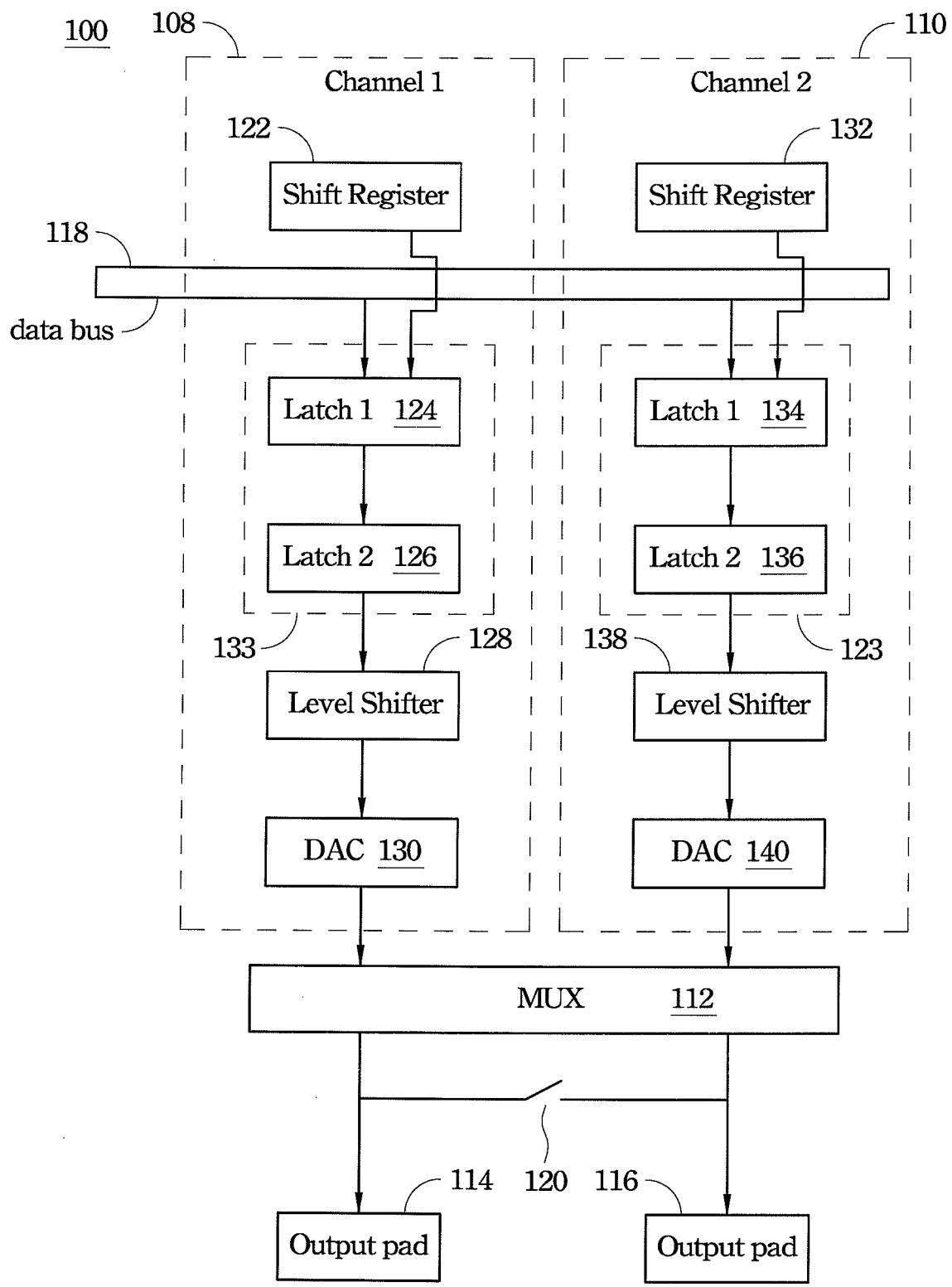
FIG. 1 shows a diagram of a conventional source driver of the LCD.
Figure 2:
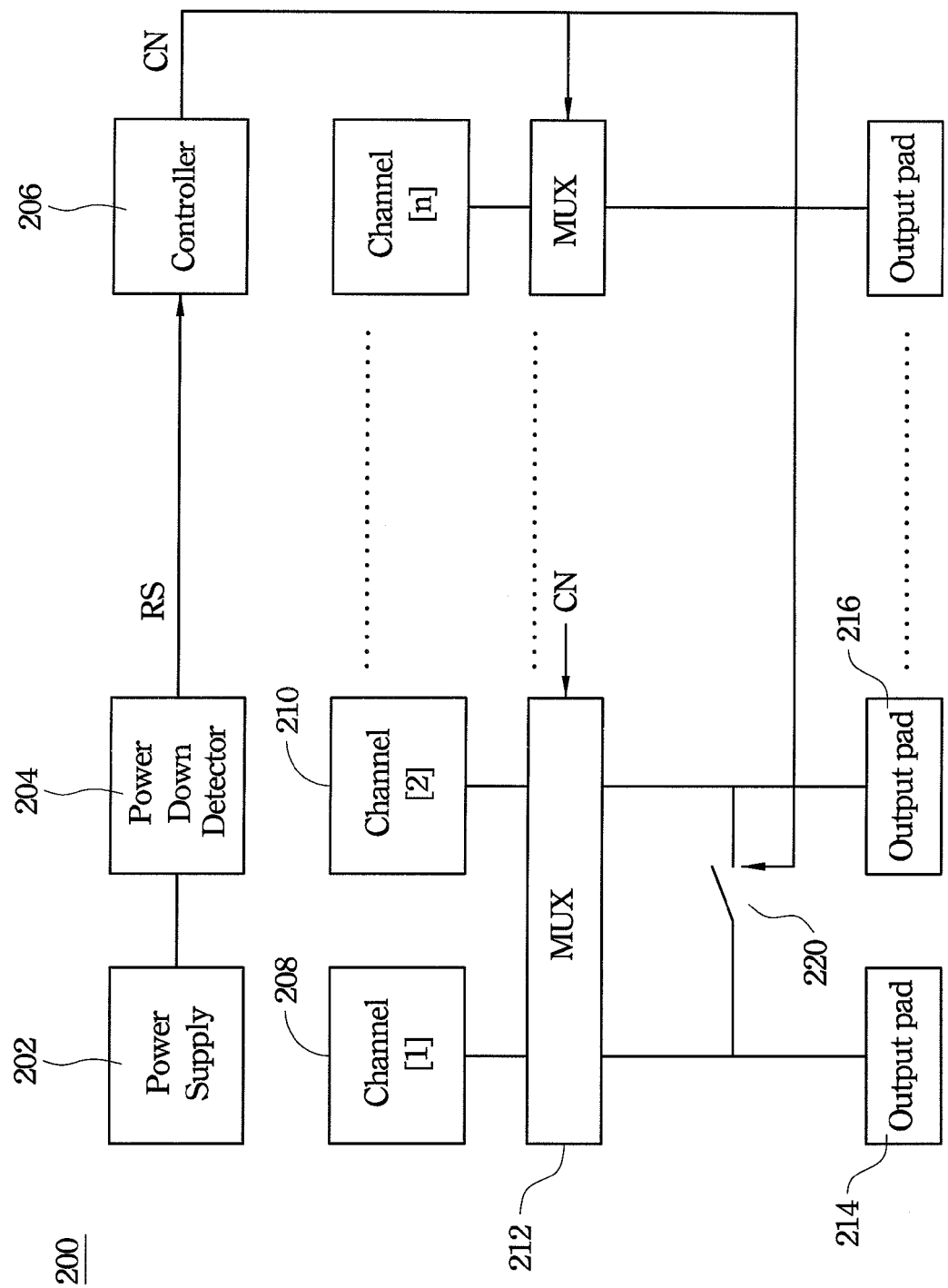
FIG. 2 shows a diagram of a source driver according to a preferred embodiment of the present invention.
Figure 3:
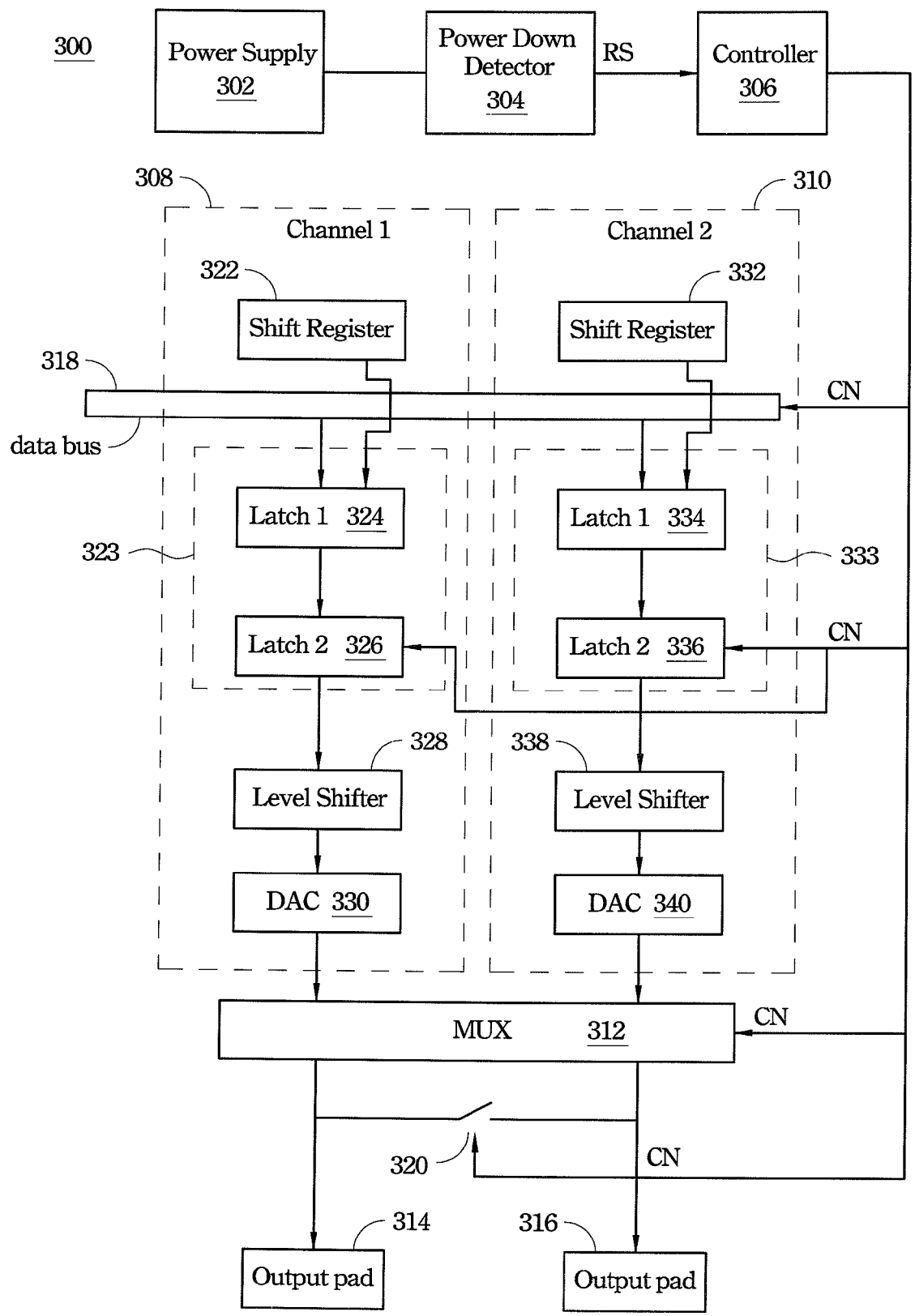
FIG. 3 shows a diagram of another source driver according to the preferred embodiment of the present invention.
Figure 4:
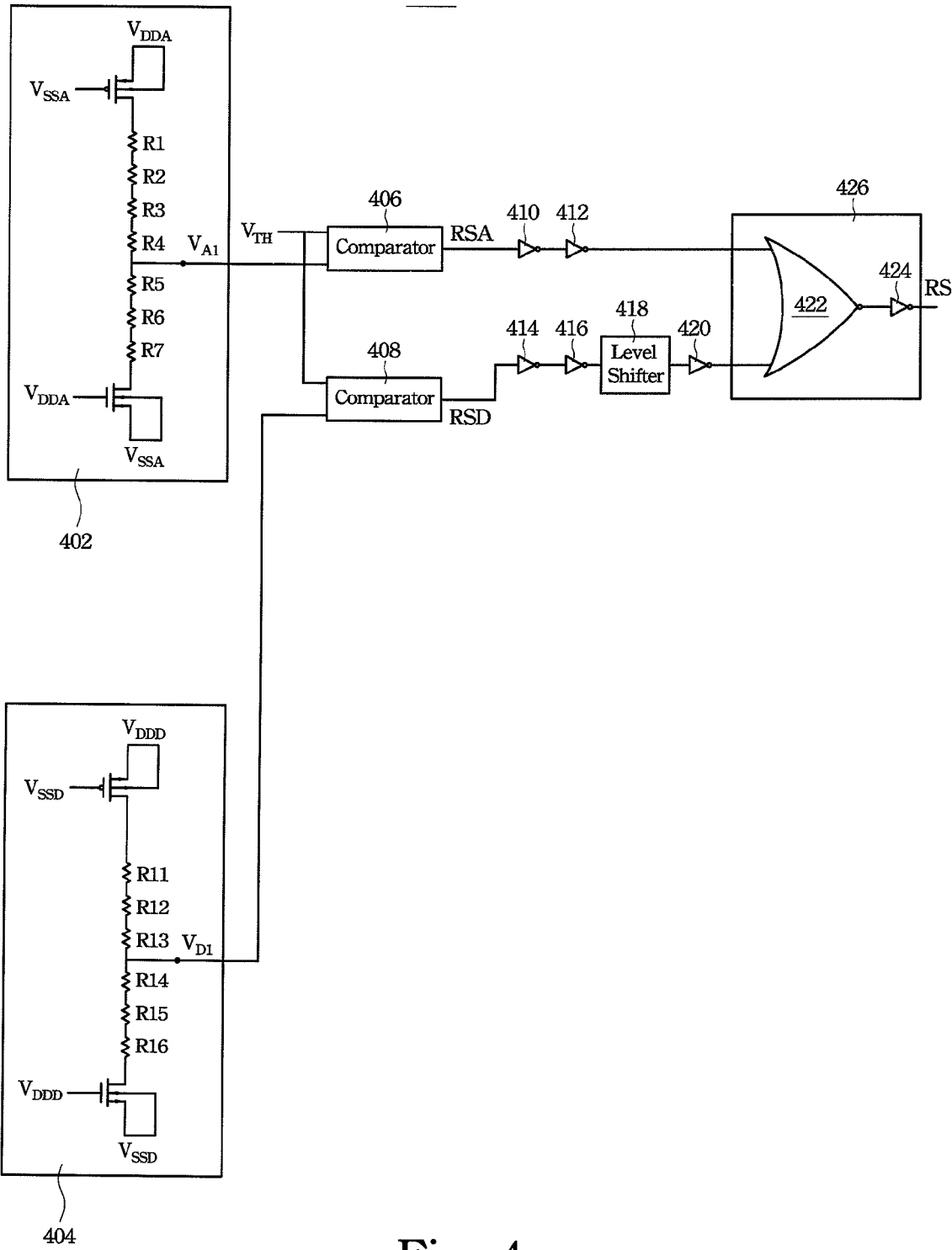
FIG. 4 shows a diagram of the power down detector according to the preferred embodiment of the present invention.

In order to make the illustration of the present invention more explicit and complete, the following description is stated with reference to FIGS. 2 through 4.

FIG. 2 shows a diagram of a source driver according to a preferred embodiment of the present invention. The source driver 200 in FIG. 2 is powered by a power supply 202, and the source driver 200 comprises channels (channel 208, channel 210 ... ), at least one multiplexer (MUX) 212, output pads (output pad 214, output pad 216 ... ) coupled to the channels via the multiplexer 212, a charge sharing switch 220 electrically connected between the output pads 214 and 216 to share the voltages on the outputs if needed, a power down detector 204 connected to the power supply 202, and a controller 206 connected to the power down detector 204. The power supply 202 may provide a first supply voltage which is at high level and a second supply voltage which is at low level.

The power down detector 204 determines whether power is turning on or off and generates a reset signal RS if yes. The determination of power on/off is made by detecting whether any one of the first supply voltage and the second supply voltage from the power supply 202 is in sufficient, that is, below certain thresholds.

The reset signal RS is sent to the controller 206. The controller 206 then generates a control signal CN in accordance with the reset signal RS and sends the control signal CN to the charge sharing switch 220 to turn off the charge sharing switch 220. The control signal CN is further sent to the multiplexer to disconnect the channels with the output pads so that the possibly abnormal data would not be transmitted to the output pads when the power supply 202 powering the source driver is being turned on/off. Thus, the display keeps showing the original image during power on/off of the power supply.

FIG. 3 shows a diagram of another source driver according to the preferred embodiment of the present invention. The source driver 300 in FIG. 3 is powered by a power supply 302, and the source driver 300 comprises channels 308 and 310, a multiplexer (MUX) 312, output pads 314 and 316, a data bus 318, a charge sharing switch 320, a power down detector 304 connected to the power supply 302, and a controller 306 connected to the power down detector 304. The output pads 314 and 316 are coupled to the channels 308 and 310 via the multiplexer 312. The charge sharing switch 320 is electrically connected between the output pads 314 and 316 of the source driver 300 to share the voltages on the outputs if needed.

Each channel has a shift register (322 or 332), a latch unit (323 or 333), a level shifter (328 or 338) and a digital-to-analog converter (DAC) (330 or 340). Each latch unit comprises a first latch (324 or 334) and a second latch (326 or 336) connected in series. The data is transmitted on the data bus 318 and stored in the latch units, and moreover, the data is stored first in the first latch and then stored in the second latch.

When the power supply 302 supplies power to the source driver 300 normally, the data in the channels is inputted to the multiplexer 312 and further sent to a display (not shown in the drawing) via the output pads 314 and 316 to show corresponding images on the display. However, when the power supply 302 is being turned on or off, the power sent to the source driver 300 becomes insufficient. The power down detector 304 generates a reset signal RS if the voltage sent from the power supply 302 is insufficient and sends the reset signal RS to the controller 306 to generate a control signal CN based on the reset signal RS. The control signal CN is sent to the charge sharing switch 320 to turn it off. Then, the control signal CN is also sent to the data bus 318 to set the data transmitted on the data bus 318 to be a predetermined value. Moreover, the control signal CN is also sent to the latch units 323 and 333 to keep the latch units 323 and 333 turned on, thereby the data is sent out from the latch units 323 and 333. The control signal CN is further sent to the multiplexer 312 to keep the multiplexers 312 turned on for outputting a driving voltage based on the data via the output pads. Thus, the output pads 314 and 316 output the predetermined voltage to a display (not shown in the drawing). Therefore, the display shows a corresponding black image or a white image during power on/off of the power supply.

It is noted that the charge sharing switch is optional in other embodiments of the present invention. Thus, the step of turning off the charge sharing switch if the power supply 302 is being turned on or off, i.e. the first supply voltage is insufficient, is also optional in other embodiments of the present invention. Furthermore, the step of keeping the latch unit on is to keep the second latch on in the preferred embodiment of the present invention.

The following describes in detail the structure of the power down detector and the generation of the reset signal RS.

FIG. 4 shows a diagram of the power down detector according to the preferred embodiment of the present invention. The power down detector 304 in FIG. 4 comprises a first voltage divider 402, a second voltage divider 404, a first comparator 406, a second comparator 408, a first inverter 410, a second inverter 412, a third inverter 414, a fourth inverter 416, a level shifter 418, a fifth inverter 420 and an OR gate 426. The OR gate 426 comprises a NOR gate 422 and a sixth inverter 424 connected in series. The first voltage divider 402 includes series-connected resistors R1-R7, and the second voltage divider 404 includes series-connected resistors R11-R16.

The first voltage divider 402 generates a first divided voltage $V_{A1}$ based on the first supply voltage VDDA from the power supply, and the second voltage divider 404 generates a second divided voltage $V_{D1}$ based on the second supply voltage VDDD from the power supply. The first comparator 406 compares the first divided voltage $V_{A1}$ with the threshold voltage $V_{TH}$ and generates a first comparison signal RSA. The first comparison signal RSA is logic high if the first divided voltage $V_{A1}$ is smaller than the threshold voltage $V_{TH}$, inferring that the power supply is insufficient due to being turned on/off. The first comparison signal RSA is logic low if the first divided voltage $V_{A1}$ is greater than the threshold voltage $V_{TH}$, inferring that the power supply supplies power to the source driver normally.

Similarly, the second comparator 408 compares the second divided voltage $V_{D1}$ with the threshold voltage $V_{TH}$ and generates a second comparison signal RSD. The second comparison signal RSD is logic high if the second divided voltage $V_{D1}$ is smaller than the threshold voltage $V_{TH}$, inferring that the power supply is being turned on/off. The second comparison signal RSD is logic low if the second divided voltage $V_{D1}$ is greater than the threshold voltage $V_{TH}$, inferring that the power supply supplies power to the source driver normally. The first supply voltage VDDA is a high voltage compared to the second supply voltage VDDD, and the first comparator is a high-voltage element and the second comparator is a low-voltage element. The setting of the first divided voltage $V_{A1}$, the second divided voltage $V_{D1}$ and the threshold voltage $V_{TH}$ can be determined and changed by users.

The threshold voltage $V_{TH}$ is generated by a circuit that is not easily affected by the decreasing output of the power supply, such as a band-gap voltage generator.

The first comparison signal RSA is sent through the first inverter 410 and the second inverter 412 and to one input node of the OR gate 426. The second comparison signal RSD is sent through the third inverter 414 and the fourth inverter 416 and then to the level shifter 418 to shift the level of the second comparison signal RSD. The level-shifted second comparison signal RSD is further sent through the fifth inverter 420 and to the other input node of the OR gate 426. If the first comparison signal RSA and the second comparison signal RSD are both logic low, the OR gate 426 outputs a logic low signal inferring that the power supply supplies power to the source driver normally so that no reset signal is generated. Contrarily, if the first comparison signal RSA and/or the second comparison signal RSD are/is logic high, the OR gate 426 outputs a logic high signal inferring that the power supply is being turned on/off and the reset signal RS is generated.

According to the aforementioned description, one advantage of the embodiment is that abnormal images shown on the display during power off of a power supply can be restrained.

According to the aforementioned description, yet another advantage of the embodiment is that a power down detector is used in the present invention to detect whether the power supply is being turned on/off and generates a reset signal if yes.

As is understood by a person skilled in the art, the foregoing preferred embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for restraining noise output by a source driver during power on/off of a power supply, the source driver including a data bus, a plurality of channels, a multiplexer and a plurality of output pads, two of the output pads being coupled via a charge sharing switch, the channels being connected to the output pads via the multiplexer, each channel having a latch unit, data being transmitted on the data bus and stored in the latch units, the source driver being powered by a first supply voltage and a second supply voltage from the power supply, the method comprising:

determining whether one of the first supply voltage and the second supply voltage is insufficient by a power down detector, and when the first supply voltage or the second supply voltage is insufficient, performing the following steps:

generating a control signal, wherein the control signal is generated according to a reset signal which is asserted when one of the first supply voltage and the second supply voltage is insufficient;

sending the control signal to the data bus to set the data transmitted on the data bus to be a predetermined value;

sending the control signal to the latch unit to keep the latch units turned on, thereby the data is sent out from the latch units;

sending the control signal to the multiplexer to keep the multiplexer turned on for outputting a driving voltage based on the data via the output pads; and sending the control signal to the charge sharing switch to turn off the charge sharing switch, wherein the power down detector further comprises:

a first voltage divider configured to receive the first supply voltage to generate a first divided voltage;

a first comparator configured to compare the first divided voltage with a threshold voltage;

a second voltage divider configured to receive the second supply voltage to generate a second divided voltage, wherein the first voltage divider and the second voltage divider are configured to respectively receive the first supply voltage and the second supply voltage at a same time;

a second comparator configured to compare the second divided voltage with the threshold voltage to determine whether the second supply voltage is insufficient; and an OR gate having two input nodes respectively coupled to outputs of the first comparator and the second comparator and to output the reset signal.

2. The method as claimed in claim 1, wherein the determining step determines whether the first supply voltage is less than the threshold voltage and/or whether the second supply voltage is less than the threshold voltage.

3. The method as claimed in claim 1, wherein the control signal is generated by a controller.

4. The method as claimed in claim 1, wherein the reset signal is generated by comparing the first divided voltage based on the first supply voltage with the threshold voltage, and if the first divided voltage is less than the threshold voltage, the reset signal is generated.

5. The method as claimed in claim 1, wherein the reset signal is generated by comparing the second divided voltage based on the second supply voltage with the threshold voltage, and if the second divided voltage is less than the threshold voltage, the reset signal is generated.

6. The method as claimed in claim 5, wherein the second divided voltage is generated by using the second voltage divider to divide the second supply voltage.

7. The method as claimed in claim 1, wherein the latch unit comprises a first latch and a second latch connected in series, the data being stored first in the first latch and then stored in the second latch, and the step of keeping the latch unit on is to keep the second latch on.

8. A source driver powered by a power supply, comprising:
a controller;
a data bus;
at least two channels, each channel having a latch unit, wherein data is transmitted on the data bus and stored in the latch units;
a multiplexer;
at least two output pads, coupled to the channels via the multiplexer, wherein the at least two output pads are coupled by a charge sharing switch; and
a power down detector configured to receive a first supply voltage and a second supply voltage and to detect whether one of the first supply voltage and the second supply voltage from the power supply is insufficient and if yes, asserting a reset signal, wherein the power down detector further comprises:
a first voltage divider configured to receive the first supply voltage to generate a first divided voltage;
a first comparator configured to compare the first divided voltage with a threshold voltage;
a second voltage divider configured to receive the second supply voltage to generate a second divided voltage, wherein the first voltage divider and the second voltage divider are configured to respectively receive the first supply voltage and the second supply voltage at a same time;
a second comparator configured to compare the second divided voltage with the threshold voltage to determine whether the second supply voltage is insufficient; and
an OR gate having two input nodes respectively coupled to outputs of the first comparator and the second comparator and to output the reset signal,
wherein when the reset signal is asserted, the controller generates a control signal based on the reset signal, wherein the control signal is sent to the data bus to set the data transmitted on the data bus to be a predetermined value, the control signal is sent to the latch units to turn on the latch units, thereby the data is sent out from the latch units, the control signal is sent to the multiplexer to turn on the multiplexer for outputting a driving voltage via the output pads based on the data, and the control signal is sent to the charge sharing switch to turn off the charge sharing switch.

9. The source driver as claimed in claim 8, wherein the first supply voltage is a high voltage compared to the second supply voltage, the first comparator is a high-voltage element and the second comparator is a low-voltage element.

10. The source driver as claimed in claim 9, wherein the power down detector further comprises a level shifter connected between the second comparator and the OR gate.

11. The source driver as claimed in claim 8, wherein the power down detector further detects whether the second supply voltage from the power supply is insufficient, and if yes, assert the reset signal.

* * * * *